United States Patent [19]

Rogerson et al.

[11] Patent Number: 4,795,934
[45] Date of Patent: Jan. 3, 1989

[54] MOUNTING OF SAW DEVICES

[75] Inventors: Stephen P. Rogerson, Woodbridge; Brian M. MacDonald, Felixstowe, both of England

[73] Assignee: British Telecommunication, plc, London, England

[21] Appl. No.: 896,092

[22] Filed: Jul. 22, 1986

Related U.S. Application Data

[62] Division of Ser. No. 795,496, Oct. 18, 1985.

[30] Foreign Application Priority Data

Feb. 20, 1984 [GB] United Kingdom ............... 8404398
Sep. 20, 1984 [GB] United Kingdom ............... 8423857

[51] Int. Cl.$^4$ .................................. H01L 41/08
[52] U.S. Cl. ........................ 310/313 R; 310/313 B; 310/344
[58] Field of Search ........... 310/313 R, 313 A, 313 B, 310/313 C, 313 D, 348, 351, 352, 353, 344; 333/150–155, 193–196

[56] References Cited

U.S. PATENT DOCUMENTS

| | | | |
|---|---|---|---|
| 3,353,263 | 6/1967 | Helms. | |
| 3,457,639 | 11/1969 | Weller. | |
| 3,488,530 | 1/1970 | Staudte | 310/348 |
| 3,612,922 | 10/1971 | Furnival | 310/351 |
| 3,872,410 | 3/1975 | Zucker | 333/195 X |
| 3,885,173 | 5/1975 | Lee. | |
| 4,047,129 | 9/1977 | Ishiyama | 310/313 R X |
| 4,266,157 | 5/1981 | Peters | 310/344 X |
| 4,329,613 | 5/1982 | Kinzel et al. | 310/353 X |
| 4,396,140 | 8/1983 | Jeffe et al. . | |
| 4,398,117 | 8/1983 | St. Cyr | 310/313 R X |
| 4,409,567 | 10/1983 | Setsune. | |
| 4,420,652 | 12/1983 | Ikeno | 310/348 X |
| 4,450,377 | 5/1984 | Briese. | |
| 4,454,444 | 6/1984 | Fujiwara et al. | 310/348 X |
| 4,494,033 | 1/1985 | Morse et al. | 310/351 X |
| 4,546,283 | 10/1985 | Adamo et al. | 310/348 X |

FOREIGN PATENT DOCUMENTS

| | | | |
|---|---|---|---|
| 2492192 | 4/1982 | France . | |
| 0168418 | 12/1981 | Japan | 310/348 |
| 0063917 | 4/1982 | Japan | 333/195 |
| 0057020 | 4/1982 | Japan | 333/195 |
| 0057018 | 4/1982 | Japan | 333/195 |
| 0083420 | 5/1983 | Japan | 333/195 |
| 0133021 | 8/1983 | Japan | 333/195 |
| 0139514 | 8/1983 | Japan | 310/344 |
| 0139513 | 8/1983 | Japan | 310/313 R |
| 0148419 | 8/1984 | Japan | 310/348 |

Primary Examiner—Mark O. Budd
Attorney, Agent, or Firm—Nixon & Vanderhyde

[57] ABSTRACT

A SAW device is formed by applying metallized areas (11) to a surface of a SAW substrate (10) and attaching conductive leads (18) to the metallized areas. The substrate is inverted and located on a hybrid circuit so that the leads (18) contact and are supported on conductive areas (30) of the circuit. This mounting arrangement minimizes the stresses which occur in the substrate in its operational life. A novel shape for the device is also disclosed.

8 Claims, 4 Drawing Sheets

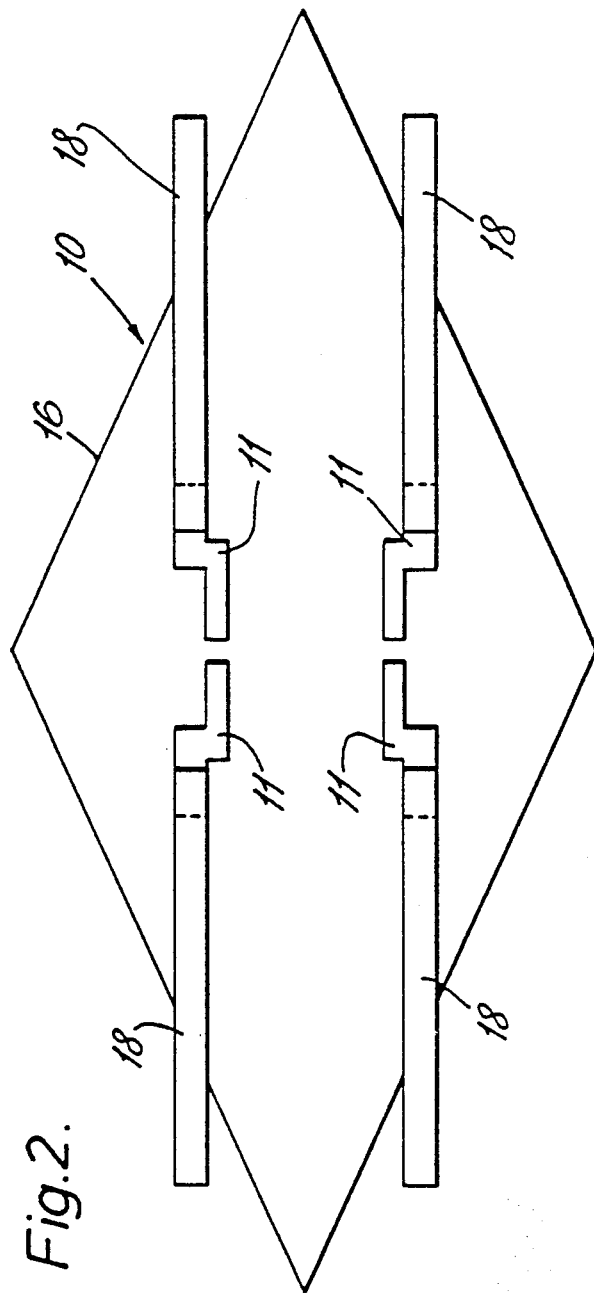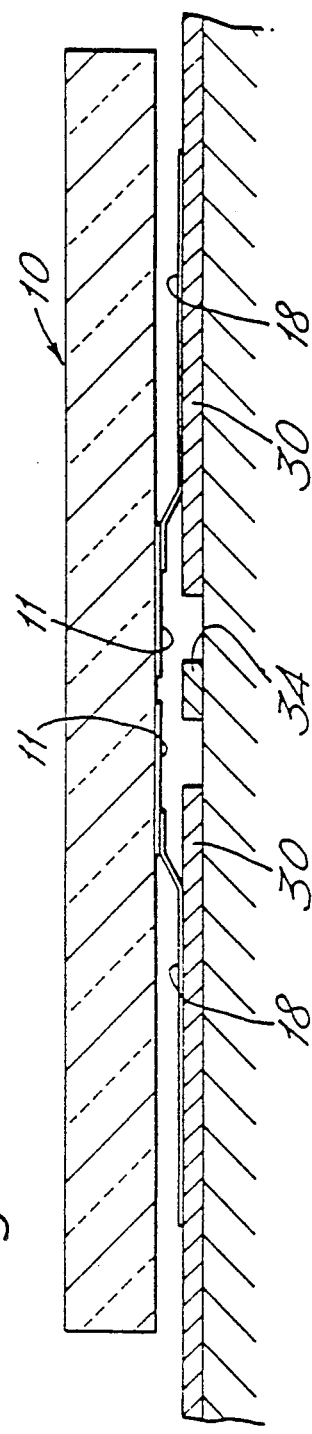

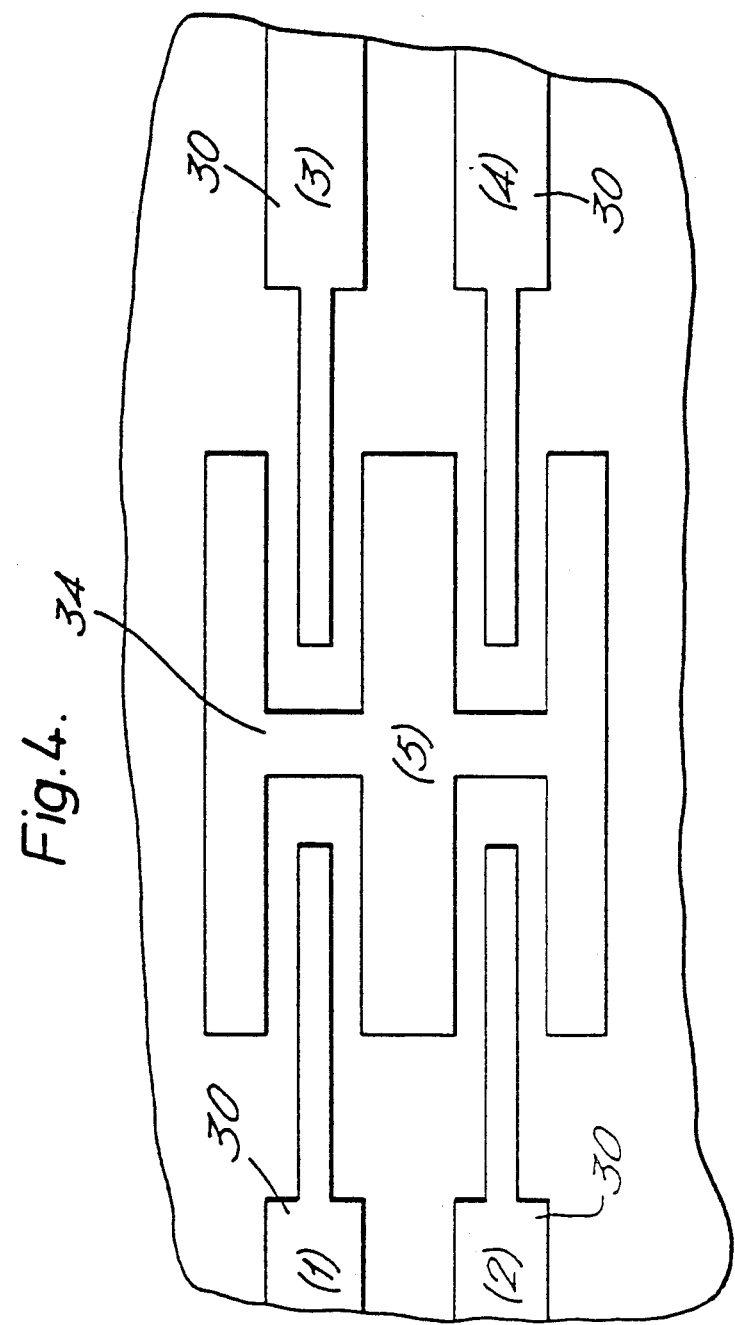

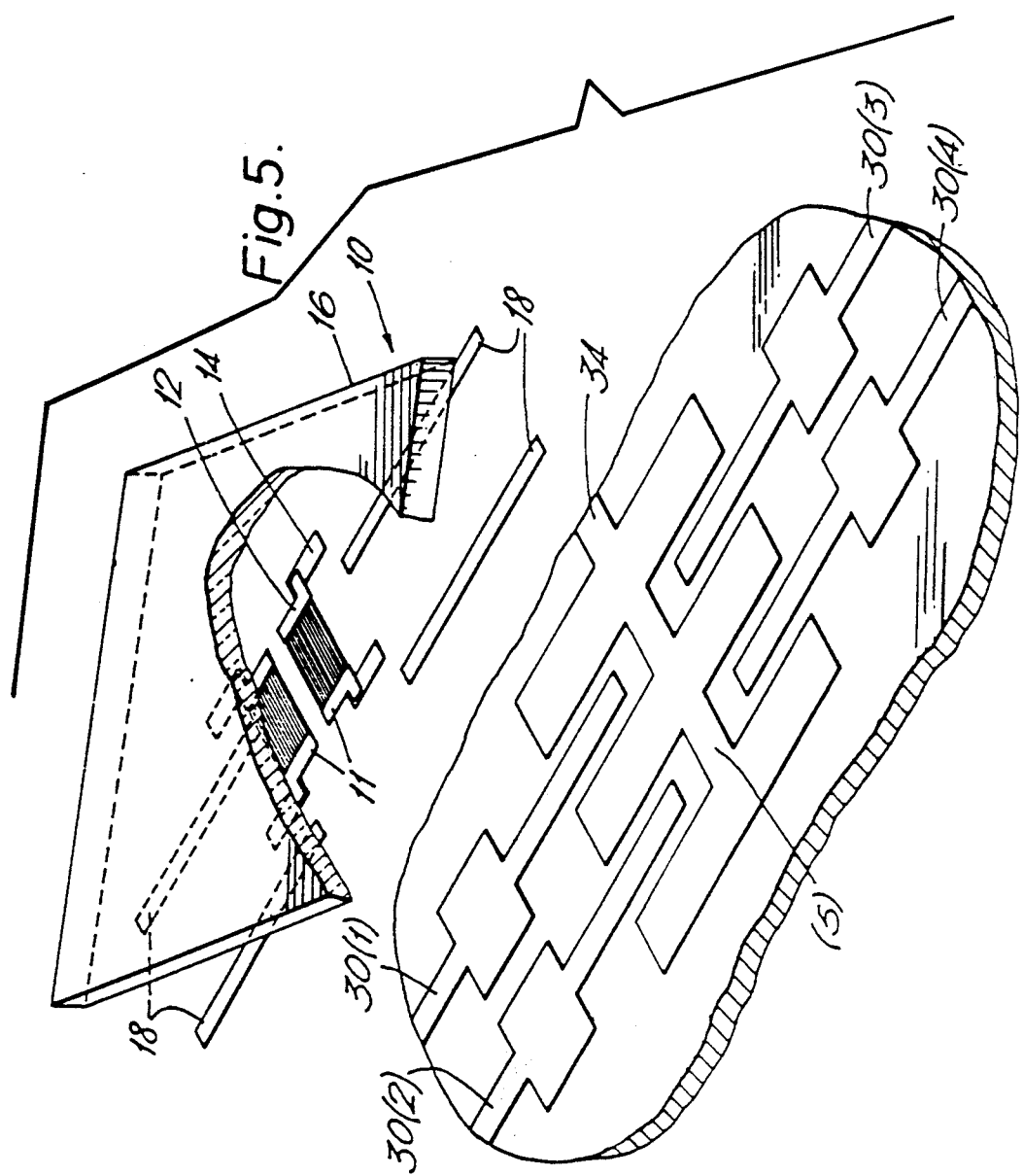

MOUNTING OF SAW DEVICES

This is a division of application Ser. No. 795,496 filed Oct. 18, 1985.

This invention relates to the construction and mounting of surface acoustic wave (SAW) devices.

SAW devices are used for example as bandpass filters in conjunction with electronic circuits. A typical known SAW device comprises a rectangular substrate of quartz on the surface of which are formed metal electrodes. These electrodes can be connected to a circuit by appropriate leads. The substrate is mounted upon a metal support to which it is bonded by an organic adhesive. The organic adhesive is usually formed round the end of the substrate to act as an acoustic absorber to reduce acoustic reflections from the end faces of the quartz. The use of metal mounted packages is not practical for thick film circuit boards with surface mounted components. It is possible to laser drill mounting holes in the thick film board for these metal packages but this is expensive. An alternative would be to mount the SAW device directly on the board using an organic adhesive. However, a problem with organic adhesives is that they emit gases, such as chlorine and water vapour, which can adversely affect the circuit with which the saw device is being used as well as the device itself. For this reason in the past SAW devices had to be packaged separately from the circuits with which they are being used.

The present invention is concerned with a method for mounting SAW devices which does not make use of organic bonding agents and which allows the completed devices to be mounted directly onto a hybrid circuit.

According to one aspect of the present invention there is provided a method of mounting a SAW device comprising applying a metallised area or areas to the surface of an appropriate substrate, attaching conductive leads to the metallised areas, locating the said surface adjacent a selected area of another substrate so that said leads contact conductive regions on the second substrate and attaching said leads to said conductive regions on the second substrate so that the first substrate is supported on the leads and the conductive regions.

The method may include the steps of forming a plurality of said metallised areas on a piece of material suitable for forming SAW devices, and then cutting said material into individual devices prior to attachment to said leads.

A particularly advantageous shape for the SAW substrate has been found to be generally diamond shaped. If this shape is employed the need for an acoustic absorber at the ends of the device is avoided.

The leads can be attached to the metallised areas by thermo-compression bonding. The leads can also be attached to the conductive regions of the second substrate by thermo-compression bonding. The second substrate may be a hybrid circuit.

The metallisation areas of the SAW substrate may include an aluminium layer and a gold layer. Preferably a titanium layer is formed between the aluminium and gold layers to prevent aluminium-gold interdiffussion.

The leads and the conductive regions on the second substrate may be formed from gold.

The SAW device may be formed from quartz.

The devices formed by the present method are particularly suitable for use with thick and thin film hybrid circuits.

According to another aspect of the present invention there is provided a hybrid circuit having a SAW device mounted thereon, said SAW device comprising a substrate metallised areas on said substrate, and conductive leads attached to said areas, said circuit having formed thereon conductive regions, and said SAW device being mounted so that said conductive leads are located on and attached to said conductive regions.

According to a further aspect of the present invention there is provided a SAW device comprising a substrate, metallised areas on said substrate, and conductive leads attached to said metallised areas. Preferably the substrate is generally diamond shaped.

The invention will be described now by way of example only with particular reference to the accompanying drawings. In the drawings:

FIG. 2 is a plan view of an SAW device formed according to the present invention;

FIG. 3 is a side elevation showing an SAW device mounted on a substrate;

FIG. 4 is a plan view of a typical conductor pattern on a substrate;

FIG. 5 is a perspective schematic view, partly cut away, of the conductor pattern and SAW device prior to mounting on the substrate.

Figure 1:
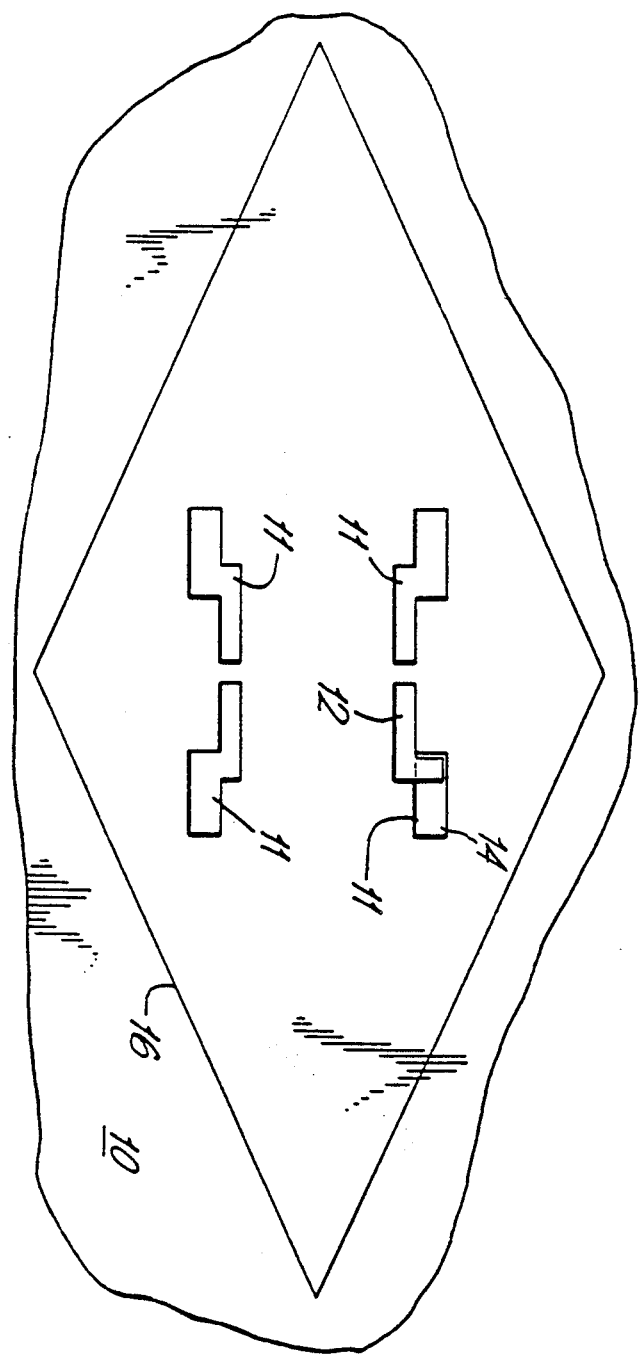
FIG. 1 is a view illustrating the first stage in the method according to the present invention.

In the present method the first step is to form a plurality of metallised areas on the surface of a slab of quartz shown generally at 10. In FIG. 1 there is shown only an area corresponding substantially to a single SAW device but it will be appreciated that the slab 10 is considerably larger than the area shown so that metallised areas for several SAW devices can be formed at the same time. The metallised areas are shown at 11 in FIG. 1. Each metallised area comprisee an L-shaped layer 12 formed of aluminium, and a rectangular layer 14 which partially over-lays one limb of the L-shape and which is formed of gold. Preferably, a layer of titanium is formed intermediate the gold and aluminium to prevent gold-aluminium migration.

Having formed the metallised areas the slab of quartz is then cut up into individual devices. The shape of each individual device is illustrated by the line 16 in FIG. 1 and can be seen to be a diamond shape. Metal tapes are attached to the gold bonding areas on the surface of each device as shown in FIG. 2 of the drawings. The metal tapes are shown by reference numeral 18 and are attached to each gold bonding area by thermo-compression bonding as described below.

Referring now also to FIG. 5, each SAW device can then be mounted on a hybrid circuit board as follows. The device is inverted so that the surface to which the leads 18 have been attached is facing downwardly. The device is located over a hybrid circuit board which has a conductor pattern as shown in FIGS. 4 and 5 of the drawings. The device is placed upon the circuit board so that the leads 18 are supported on the conductive regions shown at 30. Referring also to FIG. 3 of the drawings it will be seen that the leads 18 are in face to face contact with the conductors 30 and are supported thereby. The leads 18 are attached to the conductors 30 by thermo-compression bonding to form the completed arrangement.

The present technique has a number of advantages over the prior art. The diamond shape substrate can reduce end reflections without the need for providing any acoustic damping material at the ends of the substrate. The technique of using tape bonding to attach the device to the circuit board results in a low profile device and this helps in conjunction with the conductor arrangement shown in FIG. 4 to reduce electromagnetic breakthrough between SAW transources. The tapes can be formed in such a way that no stress is transmitted from the hybrid substrate to the quartz substrate.

In the conductor arrangement shown in FIGS. 4 and 5 the area shown by reference numeral 34 is an earth shield which helps to reduce the electromagnetic breakthrough referred to above.

A major feature of the present method is that it does not make use of any organic bonding agents in any form. Thus, the problem of out-gassing from such compounds does not occur and enables the SAW device to be mounted directly on the hybrid circuit board.

The mounting method also reduces the stresses applied to the quartz substrate during its operational life. In the prior art arrangement organic compounds hold the SAW device in a rigid manner. This does not allow for thermal expansion of the substrate relative to the metal package. Such a problem is not so marked in the present arrangement. It will be noted particularly from FIG. 3 that the SAW substrate 10 is supported mainly at areas corresponding to the metallisation areas 11. This provides a relatively stress-free mounting which should reduce the ageing of the SAW device and possibly improve its long term reliability.

EXAMPLE

The SAW filters fabricated by the present applicants are made on 1 mm thick, natural quartz cut in the ST plane. The interdigitated transducers are printed and etched in a 150 nm thick aluminium metallisation using optical photoengraving techniques. The titanium/gold bond pads are defined on top of the aluminium fingers using a lift off process such as described, for example, by Frary, J. M. and Sesse, P: 'Lift-off Techniques for Fine Line Metal Patterning', Semiconductor International, Dec., 1981, pp. 72-88. The quartz is separated into individual devices by sawing completely through the substrate with a diamond blade. As mentioned above, in order to minimise the effect of edge reflections the quartz is sawn into diamond shape chips. Acoustic waves travelling towards the apexes of the chip are greatly damped by multiple reflections between the converging edges.

To mount the SAW chip gold tape leads are attached to the transducer bond pads and, as mentioned above, the chip is directly mounted face down onto the hybrid substrate.

Gold tape of 99.99% purity measuring 0.075 mm thick and 0.375 mm wide was used for the leads. Tape lengths of 3 mm were cut and then annealed in air for 15 minutes at 800° C. immediately before use. A Dage Precima die bonder, with a sharply pointed bonding tool of hard steel in place of the normal vacuum operated suction die collect, was used to attach the beam leads to the SAW chip. The leads were positioned with one end of each lead over each transducer bonding pad and a thermocompression bond was made using the 0.125 mm diamter tip of the bonding tool. The operation was carried out in dry nitrogen using a force of 0.6 N and at a temperature of 250° C.

During bonding the leads distorted out of the plane of the quartz surface. Planarity was restored by placing the chip face downwards onto a clean polished glass surface and applying a small force to the back of the quartz.

The chip was then placed acoustic face down onto the hybrid, with the ends of the gold leads over the thick gold bonding lands. The hybrid was clamped to the heated chuck of the bonding machine and the leads bonded to the thick film, again using the pointed bonding tool that was used to attach the leads to the SAW chip. When these substrate bonds were made there was a tendency for the leads to cantilever. In order to prevent movement, a force was applied to the back of the chip whilst the bonds were being made.

The transducers with titanium/gold bond pads were tested mechanically and gave gold lead pull strengths in excess of 0.5 N and failure of these devices was due to lead breakage. In contrast, although gold leads could be bonded directly to aluminium bonding pads on the SAW chip, the pull strength of the leads was only a few grams and failure occured by the aluminium metal lifting from the quartz substrate. Assembled SAW devices with titanium/gold bond pads have been subjected to 1000 shocks at 2000 g and 1 minute vibration at 180 Hz (20 g amplitude) without failure.

Mounting the SAW devices by the method of the invention also offers improvements in the performance of the SAW devices. Firstly, the use of low profile bonding leads reduces electromagnetic breakthrough and secondly the earth plane of the thick film circuit can be positioned very close to the transducers to provide excellent screening. An overall improvement of 10 dB in the stopband rejection of SAW filters so mounted was achieved. The rippled introduced into the amplitude response was approximately ±0.05 dB.

I claim:
1. A SAW device comprising:
   a diamond-shaped electroacoustic substrate having metallized transducer and connection areas thereon; and
   conductive lead attached to said metallized connection areas;
   said metallized transducer areas including a plurality of parallel conductive lines disposed orthogonally to a diagonal between apexes of said diamond-shaped substrate such that, in operation, a SAW propagates substantially along said diagonal and undesirable edge reflections are attenuated.

2. A SAW device as in claim 1 mounted onto a parallel supporting substrate soley by said conductive leads which leads are oriented parallel to and intermediate both said substrates.

3. A hybrid circuit including a surface acoustic wave device mounted on a supporting substrate, wherein the SAW device comprises:
   a SAW propagating substrate having metallized areas including SAW transducer elements and connection bond pads disposed on one face thereof;
   connecting leads attached directly to the bond pads and arranged to run substantially parallel and in immediate proximity to the said face; and
   wherein the SAW propagating substrate is secured to the supporting substrate by attaching the connecting leads to conductive contact regions on the supporting substrate such that the SAW propagating substrate is supported by the leads in a substantially stress free manner, with the transducer face in immediate proximity to the supporting substrate and without organic bonding agents securing the device to the substrate and wherein the SAW propagating substrate is substantially diamond shaped and the transducer elements are disposed orthogonally to a diagonal between apexes of the diamond shape, such that, in operation, a SAW propagates substantially along the said diagonal and undesirable edge reflections are attenuated.

4. A hybrid circuit according to claim 3 wherein the metallized areas on the SAW propagating substrate include an aluminum layer and a gold layer.

5. A hybrid circuit according to claim 4 wherein a titanium layer is formed between the aluminum and gold layers on the SAW propagating substrate to prevent aluminum-gold interdiffusion.

6. A hybrid circuit according to claim 3 wherein the conductive leads are formed of gold tape and the SAW device is supported on the leads at a distance of the order of magnitude of the thickness of the tape away from the supporting substrate.

7. A hybrid circuit according to claim 3 wherein the SAW propagating substrate comprises quartz.

8. A hybrid circuit according to claim 3 wherein the transducer face of the SAW device is positioned immediately above an earth shield region of the supporting substrate.

* * * * *